(12) United States Patent
Lee et al.

(10) Patent No.: US 8,797,706 B2
(45) Date of Patent: Aug. 5, 2014

(54) HEATED ANNULUS CHUCK

(75) Inventors: William Davis Lee, Newburyport, MA (US); Gary M. Cook, Newton, MA (US); Perry J. I. Justesen, Beverly, MA (US); Ashwin M. Purohit, Gloucester, MA (US); Robert D. Rathmell, Murphy, TX (US); Allan D. Weed, Marblehead, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 367 days.

(21) Appl. No.: 13/154,836

(22) Filed: Jun. 7, 2011

(65) Prior Publication Data

US 2011/0299218 A1 Dec. 8, 2011

Related U.S. Application Data

(60) Provisional application No. 61/352,665, filed on Jun. 8, 2010, provisional application No. 61/352,554, filed on Jun. 8, 2010.

(51) Int. Cl.
*H01L 21/687* (2006.01)

(52) U.S. Cl.
USPC .......................................... 361/234

(58) Field of Classification Search
CPC ................. H01L 21/6833; H01L 21/6831
USPC .......................................... 361/234
See application file for complete search history.

(56) References Cited

U.S. PATENT DOCUMENTS

| | | | |
|---|---|---|---|
| 5,059,770 A | 10/1991 | Mahawili | |
| 5,155,652 A | 10/1992 | Logan et al. | |
| 5,262,029 A | 11/1993 | Erskine et al. | |
| 5,294,778 A | 3/1994 | Carman et al. | |
| 5,350,479 A | 9/1994 | Collins et al. | |
| 5,663,865 A | 9/1997 | Kawada et al. | |
| 5,793,192 A | 8/1998 | Kubly et al. | |
| 5,968,273 A | 10/1999 | Kadomura et al. | |
| 6,034,863 A * | 3/2000 | Marohl et al. | 361/234 |

(Continued)

FOREIGN PATENT DOCUMENTS

EP  0847085 A2  6/1998

OTHER PUBLICATIONS

U.S. Appl. No. 13/152,735, filed Jun. 3, 2011. 23 Pages.

(Continued)

*Primary Examiner* — Rexford Barnie
*Assistant Examiner* — Angela Brooks
(74) *Attorney, Agent, or Firm* — Eschweiler & Associates, LLC

(57) ABSTRACT

A clamping device and method is provided for securing first and second workpieces having different sizes to a clamping device and providing thermal conditioning thereto. An electrostatic clamping plate having a diameter associated with the first workpiece surrounds a central portion of the clamp. A non-electrostatic central portion provides a heater within the annulus, wherein the central portion has a diameter associated with the second workpiece. A workpiece carrier is provided, wherein the workpiece carrier is configured to hold the second workpiece above the heater, and wherein a diameter of the workpiece carrier is associated with the electrostatic clamping plate annulus. The annulus selectively electrostatically clamps the workpiece carrier or a circumferential portion of the first workpiece to its clamping surface, therein selectively maintaining a position of the first or second workpiece with respect to the annulus or non-electrostatic central portion.

20 Claims, 12 Drawing Sheets

(56) References Cited

U.S. PATENT DOCUMENTS

| | | | |
|---|---|---|---|
| 6,065,499 A * | 5/2000 | Pless et al. | 138/118 |
| 6,080,970 A | 6/2000 | Yoshida et al. | |
| 6,088,213 A * | 7/2000 | Herchen | 361/234 |
| 6,273,484 B1 | 8/2001 | Peng | |
| 6,476,399 B1 * | 11/2002 | Harrington et al. | 250/492.21 |
| 6,483,690 B1 | 11/2002 | Nakajima et al. | |
| 6,730,175 B2 | 5/2004 | Yudovsky et al. | |
| 8,478,116 B2 * | 7/2013 | Henry et al. | 392/453 |
| 2002/0014894 A1 * | 2/2002 | Yonezawa et al. | 324/760 |
| 2003/0218144 A1 | 11/2003 | Lin et al. | |
| 2005/0076531 A1 | 4/2005 | Smith et al. | |
| 2008/0067436 A1 * | 3/2008 | Vanderberg et al. | 250/492.21 |
| 2008/0144251 A1 * | 6/2008 | Tao et al. | 361/234 |
| 2009/0114158 A1 * | 5/2009 | Zucker et al. | 118/729 |
| 2009/0273878 A1 * | 11/2009 | Lee et al. | 361/234 |
| 2010/0110603 A1 * | 5/2010 | LaFontaine et al. | 361/234 |
| 2010/0171044 A1 * | 7/2010 | Lee et al. | 250/491.1 |
| 2011/0260047 A1 * | 10/2011 | Lee | 250/282 |
| 2011/0291023 A1 * | 12/2011 | Lee et al. | 250/453.11 |
| 2011/0291030 A1 * | 12/2011 | Lee | 250/492.21 |
| 2011/0292562 A1 * | 12/2011 | Lee et al. | 361/234 |
| 2011/0297845 A1 * | 12/2011 | Ota et al. | 250/453.11 |
| 2011/0299218 A1 * | 12/2011 | Lee et al. | 361/234 |

OTHER PUBLICATIONS

Non-Final Office Action dated Oct. 3, 2013 for U.S. Appl. No. 13/152,735. 25 Pages.

Office Action Dated May 9, 2014 U.S. Appl. No. 13/152,735.

* cited by examiner

HEATED ANNULUS CHUCK

REFERENCE TO RELATED APPLICATION

This application claims priority to and the benefit of U.S. Provisional Application Ser. No. 61/352,665 which was filed Jun. 8, 2010, entitled "HEATED ANNULUS CHUCK", and U.S. Provisional Application Ser. No. 61/352,554 which was also filed Jun. 8, 2010, entitled "HEATED ELECTROSTATIC CHUCK INCLUDING MECHANICAL CLAMP CAPABILITY AT HIGH TEMPERATURE", the entireties of which are hereby incorporated by reference as if fully set forth herein.

FIELD OF THE INVENTION

The present invention relates generally to semiconductor processing equipment, including but not limited to, ion implantation systems, and more specifically to an electrostatic chuck having an electrostatic annulus and a heated center portion for use in ion implantation applications.

BACKGROUND OF THE INVENTION

Electrostatic clamps or chucks (ESCs) are often utilized in the semiconductor industry for clamping and maintaining workpieces or substrates in a fixed position relative to a support or clamping surface during plasma-based or vacuum-based semiconductor processes such as ion implantation, etching, chemical vapor deposition (CVD), etc. Electrostatic clamping capabilities of the ESCs, as well as workpiece temperature control, have proven to be quite valuable in processing semiconductor substrates or wafers, such as silicon wafers. A typical ESC, for example, comprises a dielectric layer positioned over a conductive electrode or backing plate, wherein the semiconductor wafer is placed on a surface of the ESC (e.g., the wafer is placed on a surface of the dielectric layer). During semiconductor processing (e.g., ion implantation), a clamping voltage is typically applied between the wafer and the electrode, wherein the wafer is clamped against the chuck surface by electrostatic forces.

In some circumstances, it is desirable to process different size workpieces. However, conventional systems are designed to either handle a single size workpiece, or to exchange workpiece clamping devices to accommodate variable workpiece sizes. Further, depending on desired heating and/or cooling of the workpiece during processing for certain applications, significant and time-consuming changes to the clamping device may be necessitated in order to achieve the desired processing.

SUMMARY OF THE INVENTION

The inventors appreciate a need for an improved electrostatic clamp, wherein both high temperature processing and low temperature processing can be achieved via a single ESC capable of receiving and supporting various sized workpieces, while adequately maintaining a clamping force on the workpiece, and minimizing downtime caused by changing clamping devices.

The present disclosure overcomes the limitations of the prior art by providing a system, apparatus, and method for clamping workpieces of various sizes in a semiconductor processing system. In addition, the present invention overcomes the limitations of the prior art by providing a system, apparatus, and method for selectively heating workpieces of various sizes in a semiconductor processing system, wherein the workpieces can be maintained in a fixed position on a clamping surface by either electrostatic forces, mechanical forces, or both.

Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present disclosure is directed generally toward an apparatus, system, and method for selectively maintaining a position of variously-sized workpieces, while further providing a heating and/or cooling of the workpieces utilizing a common workpiece clamping device.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
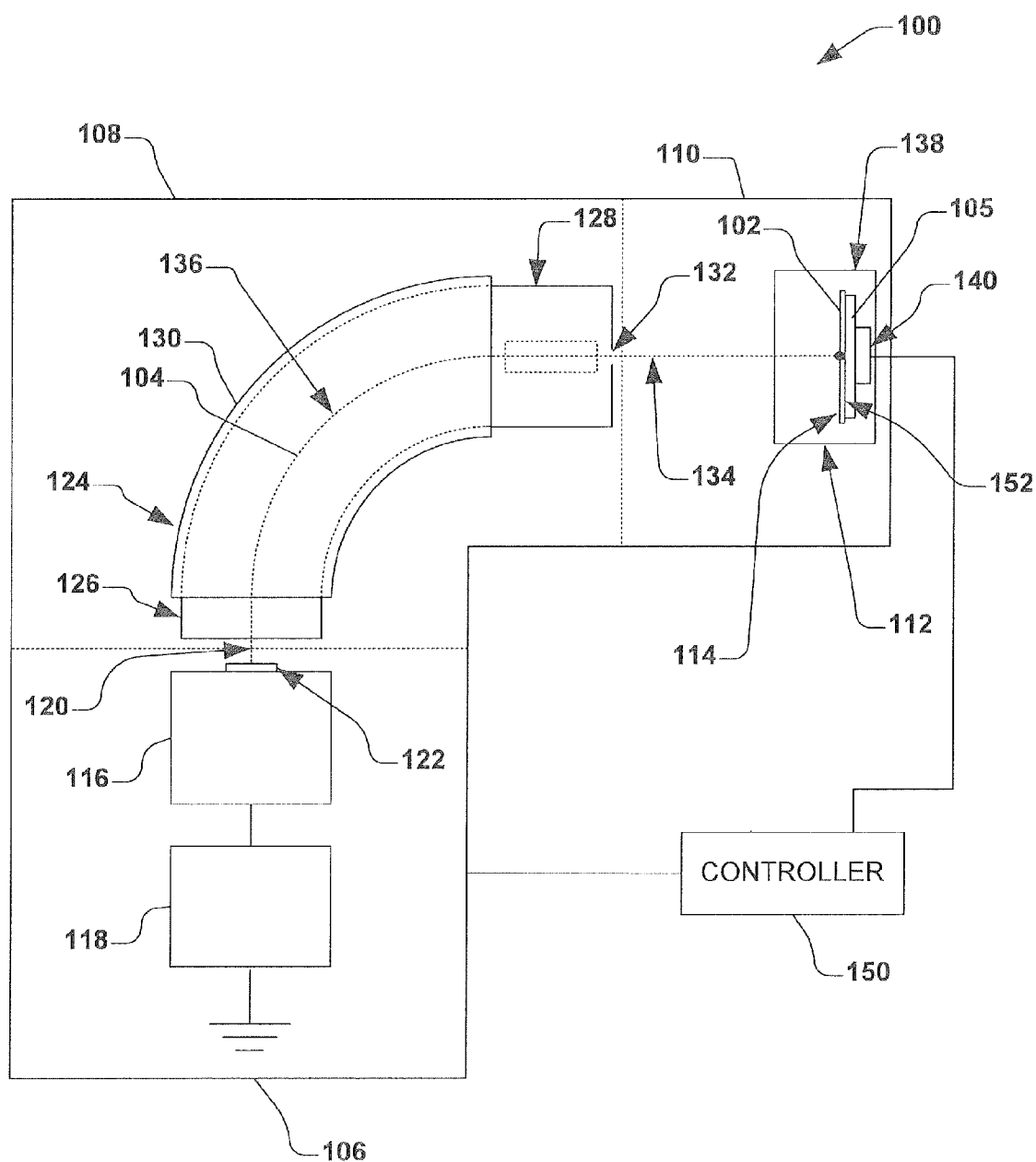
FIG. 1 is a schematic of an exemplary ion implantation system according to one aspect of the disclosure.

The present disclosure is directed generally toward an electrostatic clamp (ESC), also called an electrostatic chuck, that provides both clamping and temperature control of various-sized workpieces using the same electrostatic clamp. The disclosure is further directed to a clamping mechanism and method that enables heating workpieces of various sizes in a semiconductor processing system, wherein the workpieces can be maintained in a fixed position on a clamping surface by either electrostatic forces, mechanical forces, or both.

Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

In an ion implantation system, for example, an ESC is utilized to electrostatically clamp a workpiece (e.g., a semiconductor wafer comprising one or more of silicon, silicon carbide, germanium, and gallium arsenide) to a clamping surface thereof for maintaining the workpiece in a fixed position on the clamping surface during ion implantation and processing. Ion implantation and processing of the workpiece, for example, can involve transporting the workpiece and subjecting the workpiece to various translational forces.

In accordance with the present disclosure, the ESC is configured to hold and/or clamp workpieces of various sizes, such as semiconductor wafers varying in size from 100 mm to 150 mm in diameter, up to 300 mm in diameter or more. Indeed, industry roadmaps contemplate next generation semiconductor wafer sizes scaling to 450 mm in diameter. Further, the inventors appreciate a need existing for the ability to vary thermal properties of the ESC in order to apply and/or remove thermal energy to and/or from the wafer. The application of thermal energy to the workpiece, for example, is selectively based, at least in part, on the size of the workpiece. The present invention advantageously provides an exemplary electrostatic chuck configured to process variable or various sized workpieces utilizing the same electrostatic chuck, Further, selective heating and/or cooling of small and/or large workpieces is accommodated on the same electrostatic chuck, based on a configuration thereof. For example, the electrostatic chuck of the present disclosure provides for selective heating and clamping of small-diameter workpieces, as well as selective cooling and clamping of larger-diameter workpieces during various processing cycles.

Referring now to the figures, in accordance with one exemplary aspect of the present invention, FIG. 1 illustrates an exemplary ion implantation system 100, wherein the ion implantation system is operable to scan a workpiece 102 (e.g., a semiconductor substrate or wafer comprising one or more of silicon, silicon carbide, germanium, and gallium arsenide) relative to an ion beam 104, therein implanting ions into the workpiece. An electrostatic clamp 105 (also called an electrostatic chuck or ESC) generally clamps the workpiece 102 thereto, as will be discussed in greater detail infra. As stated above, various aspects of the present invention may be implemented in association with any type of semiconductor processing apparatus or system, including, but not limited to, the exemplary ion implantation system 100 of FIG. 1.

The exemplary ion implantation system 100, for example, comprises a terminal 106, a beamline assembly 108, and an end station 110 that generally forms a process chamber 112, wherein the ion beam 104 is generally directed at the workpiece 102 positioned at a workpiece location 114. An ion source 116 in the terminal 106 is powered by a power supply 118 to provide an extracted ion beam 120 (e.g., an undifferentiated ion beam) to the beamline assembly 108, wherein the ion source comprises one or more extraction electrodes 122 to extract ions from the source chamber and thereby to direct the extracted ion beam toward the beamline assembly 108.

The beamline assembly 108, for example, comprises a beamguide 124 having an entrance 126 proximate to the source 116 and an exit 128 proximate to the end station 110. The beamguide 124, for example, comprises a mass analyzer 130 (e.g., a mass analysis magnet) that receives the extracted ion beam 120 and creates a dipole magnetic field to pass only ions of appropriate energy-to-mass ratio or range thereof through a resolving aperture 132 to the workpiece 102. The ions passed through the mass analyzer 130 and exit the resolving aperture 132 generally define a mass analyzed or desired ion beam 134 having ions of the desired energy-to-mass ratio or range thereof. Various beam forming and shaping structures (not shown) associated with the beamline assembly 108 may be further provided to maintain and bound the ion beam 104 when the ion beam is transported along a desired beam path 136 to the workpiece 102.

In one example, the desired ion beam 134 is directed toward the workpiece 102, wherein the workpiece is generally positioned via a workpiece scanning system 138 associated with the end station 110. The end station 110 illustrated in FIG. 1, for example, may comprise a "serial" type end station that provides a mechanical scanning of the workpiece within the evacuated process chamber 112, in which the workpiece 102 (e.g., a semiconductor wafer, display panel, or other workpiece) is mechanically translated through the beam path 136 in one or more directions via a workpiece scanning system 138. According to one exemplary aspect of the present invention, the ion implantation system 100 provides the desired ion beam 134 (e.g., also referred to as a "spot beam" or "pencil beam") as being generally stationary, wherein the workpiece scanning system 138 generally translates the workpiece 102 in two generally orthogonal axes with respect to the stationary ion beam. It should be noted, however, that batch or other type end stations may alternatively be employed, wherein multiple workpieces 102 may be scanned simultaneously, and such end stations are contemplated as falling within the scope of the present invention.

In another example, the system 100 may comprise an electrostatic beam scanning system (not shown) operable to scan the ion beam 104 along one or more scan planes relative to the workpiece 102. Accordingly, the present invention further contemplates any scanned or non-scanned ion beam 104 as falling within the scope of the present invention. In accordance with one embodiment of the present invention, the workpiece scanning system 138 comprises a scan arm 140, wherein the scan arm is configured to reciprocally scan the workpiece 102 with respect to the ion beam 104. The ion implantation system 100, for example, is further controlled by a controller 150, wherein functionality of the ion implantation system and workpiece scanning system 138 is controlled via the controller.

Figure 2:
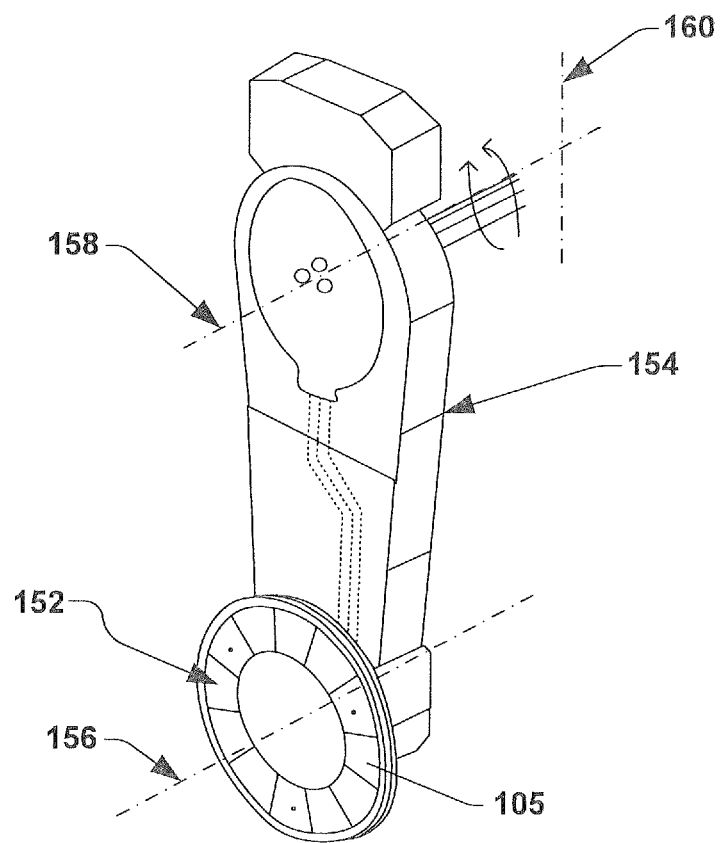
FIG. 2 is a perspective view of an exemplary scan arm according to another aspect of the disclosure.

In accordance with the disclosure, the exemplary ESC 105 is utilized to electrostatically hold the workpiece 102 to a clamping surface 152 thereof. According to one example, the workpiece scanning system 138 comprises a scan arm 154, as illustrated in FIG. 2, wherein the ESC 105 is operably coupled to the scan arm. For example, the ESC 105 is rotatably coupled to the scan arm 154, wherein the ESC is configured to rotate about a first axis 156. The scan arm 154, for example, is further configured to rotate about a second axis 158, as well as to translate, such as along an third axis 160 that is generally perpendicular to the second axis. Thus, the scan arm 154 is configured to selectively translate and/or rotate the workpiece 102 of FIG. 1 through the ion beam 134.

Figure 3:
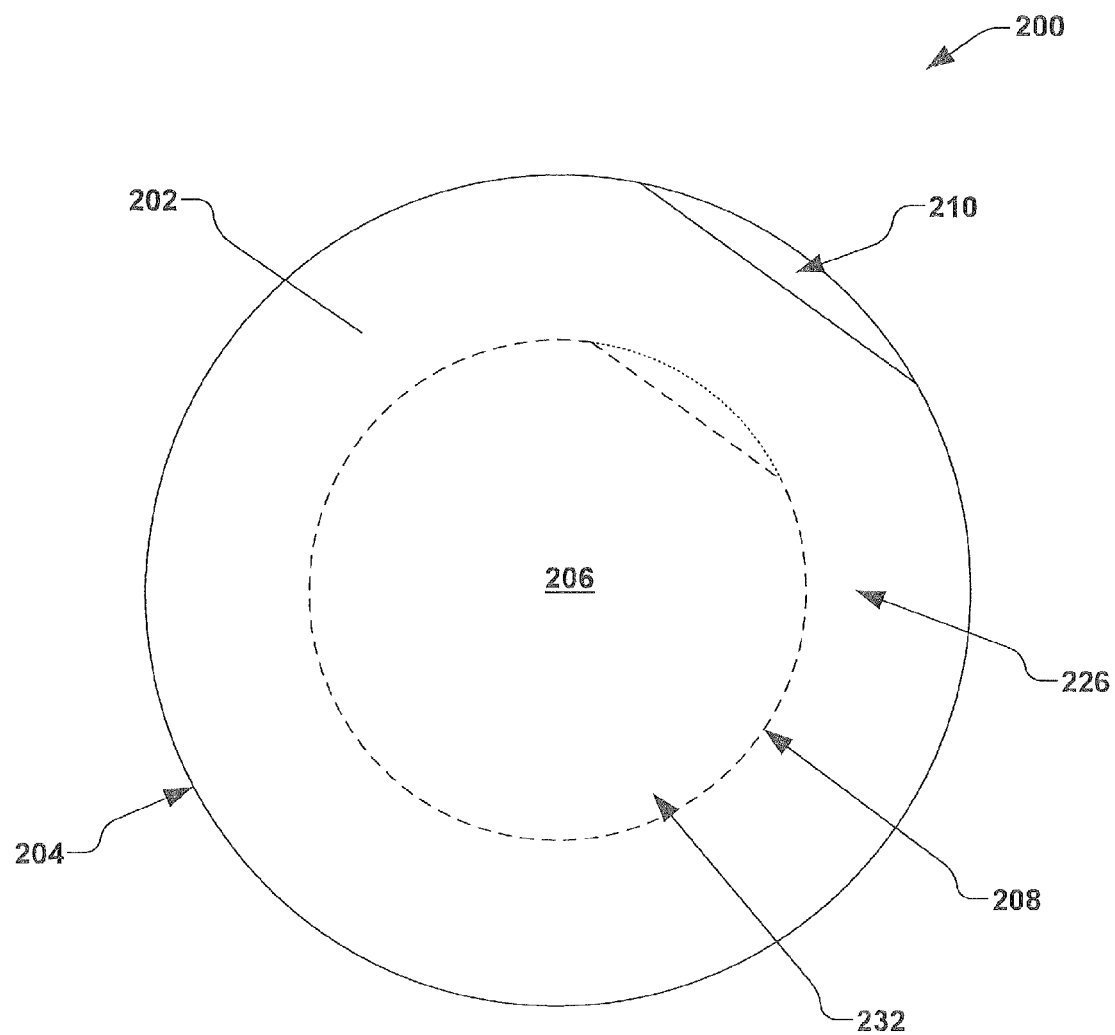
FIG. 3 is a plan view of an exemplary clamping device clamping varying sizes of workpieces according to the disclosure.

In accordance with one exemplary aspect of the disclosure, the ESC 105 of FIGS. 1 and 2 comprises an exemplary clamping device 200, further illustrated in greater detail in FIG. 3. The clamping device 200 of FIG. 3, for example, is configured for clamping variably-sized workpieces 102 of FIGS. 1 and 2, while further providing variable thermal conditioning of the workpiece(s) during processing, as will be further discussed infra. Processing of the workpiece(s) during clamping thereof via the clamping device 200 of FIG. 3, for example, comprises an ion implantation via the ion implantation system 100 as shown in FIG. 1, or any other semiconductor processing system wherein clamping of variably-sized workpieces is desired.

As illustrated in FIG. 3, the clamping device 200, for example, is configured to selectively clamp a first workpiece 202 of a first size 204 (e.g., a semiconductor wafer having diameter of 300 mm) to the clamping device in a first mode, and to clamp a second workpiece 206 of a second size 208 (e.g., a semiconductor wafer having a diameter of 150 mm, illustrated in dashed lines) with respect to a clamping surface 210 of the clamping device, in a second mode. In the present example, the first size 204 of the first workpiece 202 is larger than the second size 208 of the second workpiece 206. The first workpiece 202, in another example, comprises a 150 mm silicon wafer, while the second workpiece 206 comprises a 100 mm silicon carbide workpiece.

Figure 4:
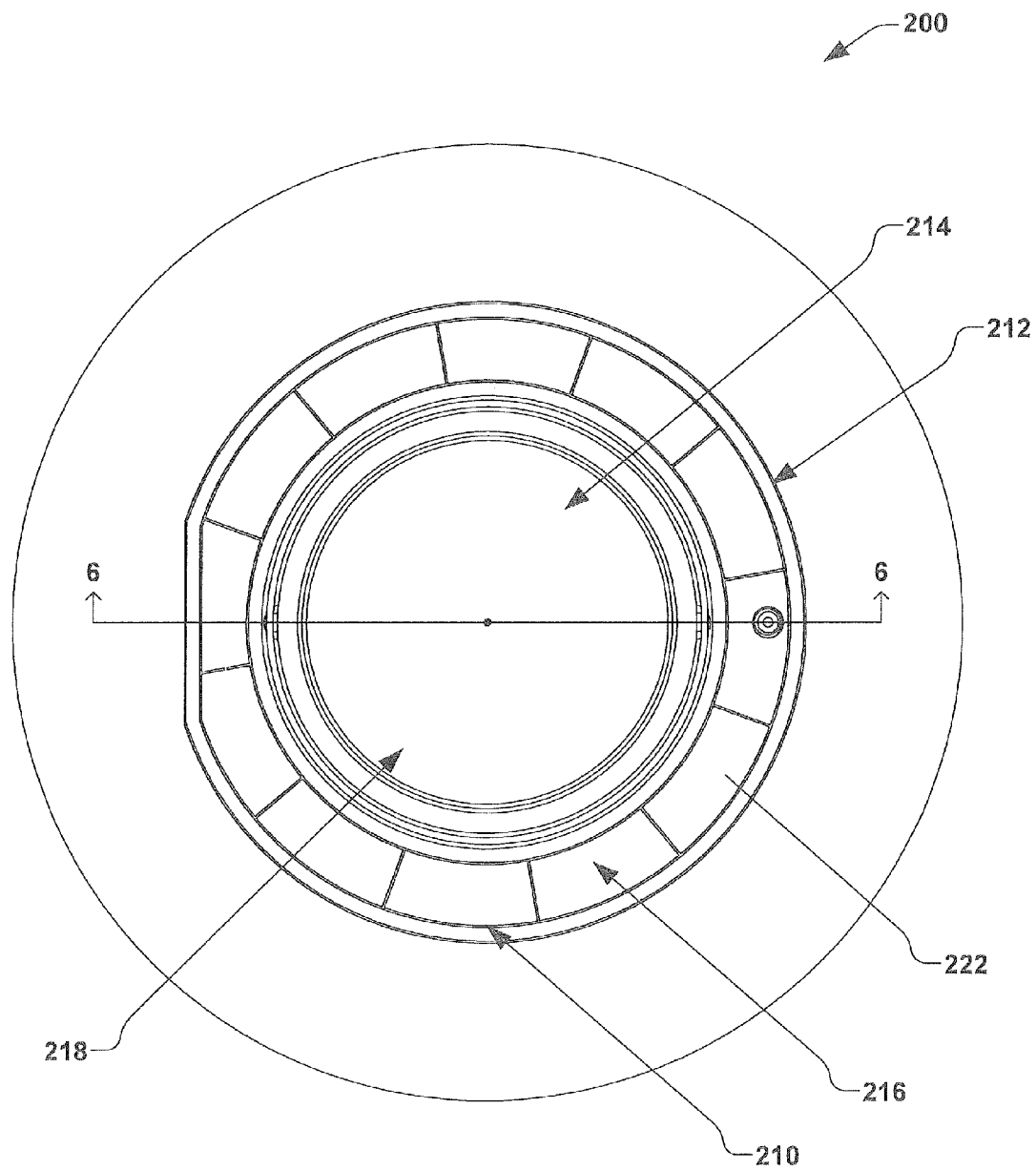
FIG. 4 is a plan view of an exemplary clamping device according to another aspect of the disclosure.

In accordance with a preferred embodiment of the present invention, the clamping device 200, as illustrated in greater detail in FIG. 4, for example, comprises an annulus 212 and a central portion 214 surrounded by the annulus. The annulus 212, for example, comprises an annular electrostatic chuck 216, and the central portion 214 of the clamping device 200 comprises a heater 218, as will be detailed further hereinafter. The annulus 212 (e.g., the annular electrostatic chuck 216), for example, is illustrated in greater detail in FIGS. 5 and 6 and comprises one or more electrodes 220 disposed beneath a dielectric layer 222 (e.g., a dielectric layer), wherein the dielectric layer generally defines a clamping surface 224 of the annulus and generally permits a capacitance to build between the first workpiece 202 of FIG. 3, for example, and one or more electrodes positioned within the annular electrostatic chuck 216.

Figure 5:
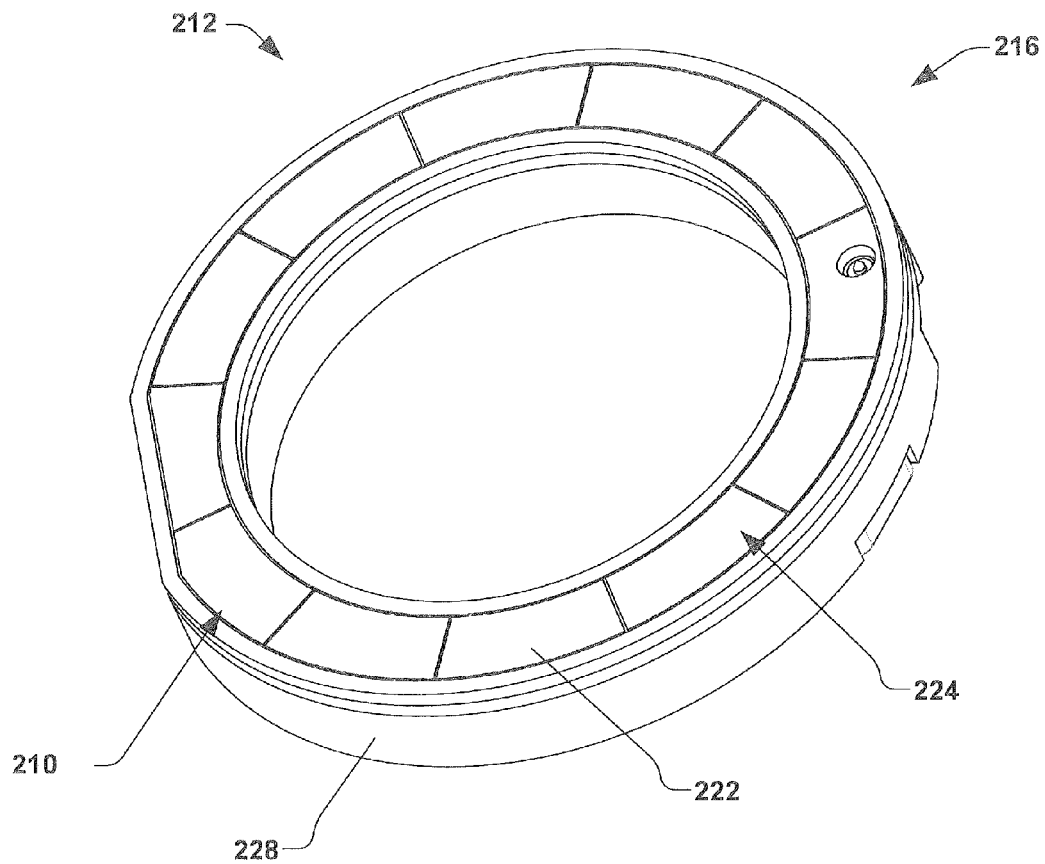
FIG. 5 is a perspective view of an annular electrostatic chuck according to another exemplary aspect of the disclosure.
Figure 6:
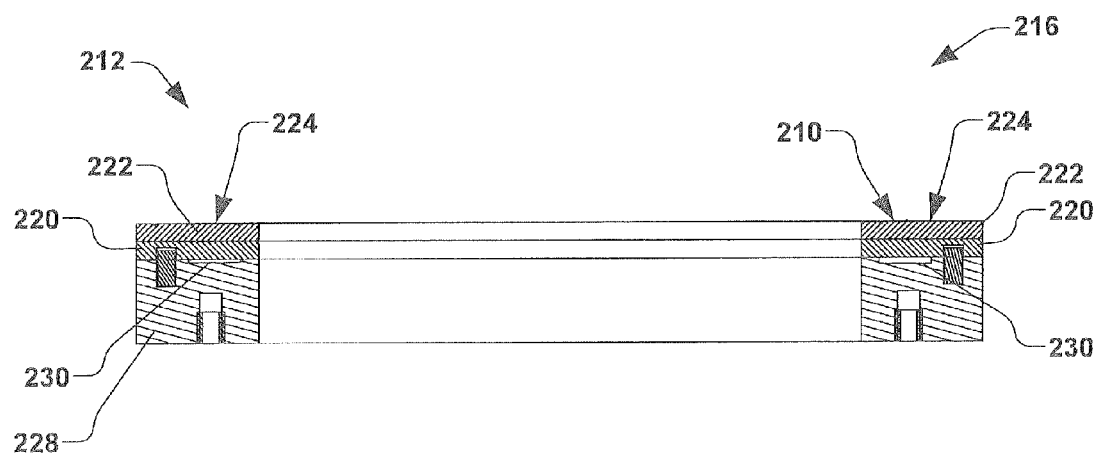
FIG. 6 is a cross-sectional view of an annular electrostatic clamp in accordance with another exemplary aspect of the disclosure.

The annulus 212, for example, is sized and configured to electrostatically clamp a circumferential region 226 of FIG. 3 of the first workpiece 202. The annulus 212, as illustrated in FIGS. 5 and 6, for example, further comprises a backing plate 228 (e.g., an aluminum plate), and wherein the backing plate provides a structural rigidity to the annular ESC 216. The backing plate 228 may also provide a structure by which cooling or heating can be applied to the annular ESC 216, such as through one or more cooling channels 230, one or more heaters (not shown), or the like.

The annulus 212, in another example, is configured such that when the first workpiece 202 of FIG. 3 is electrostatically clamped thereon, the circumferential region 226 of the first workpiece contacts the clamping device 200, while a central region 232 of the first workpiece may or may not contact the central portion 214 (e.g., the heater 218) of the clamping device. It will be understood that the clamping forces provided by the annulus 212, for example, are sufficient to maintain the first workpiece 202 in a fixed position relative to the clamping surface 224 of the clamping device 200. When operated in the first mode, for example, wherein the first workpiece 202 is clamped to the clamping surface 224 of the annulus 212, the heater 218 is not operated, and the clamping device 200 operates such that the annulus maintains the first workpiece in a fixed position on clamping surface 224.

As such, when operated in the first mode, the annulus 212, for example, may be thermally cooled by the one or more cooling channels 230 defined therein, wherein water or another coolant is flowed through the one or more cooling channels. For example, during an ion implantation into the first workpiece 202 via the ion implantation system 100 of FIG. 1, a dosage of the ion implantation is limited in order to ensure that the heat capacity of the first workpiece is sufficient to limit a maximum temperature experienced by the first workpiece. As such, when operated in the first mode in the present example, the clamping device 200 provides a temperature control to the first workpiece 202 such that the first workpiece is cooled to advantageously process the workpiece.

Figure 7:
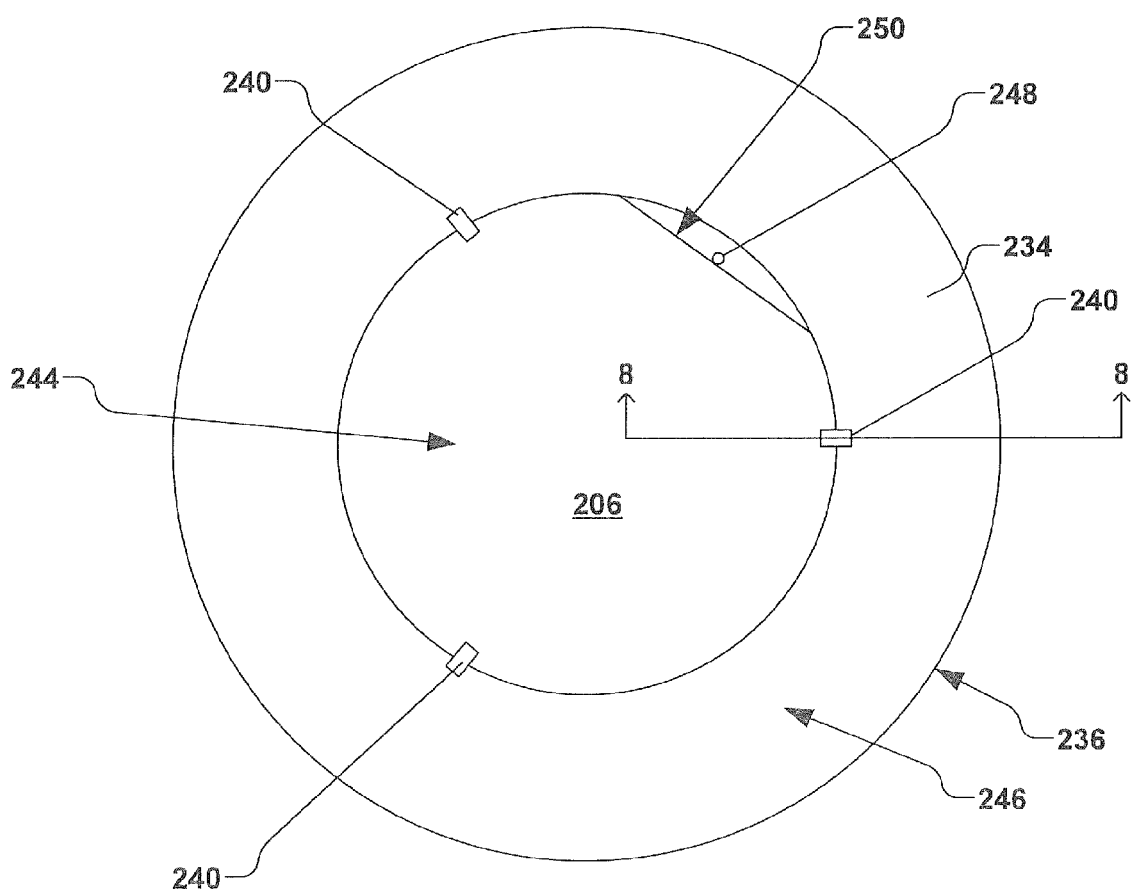
FIG. 7 is a plan view of a second workpiece being clamped to the clamping device according to another example of the disclosure.
Figure 8:
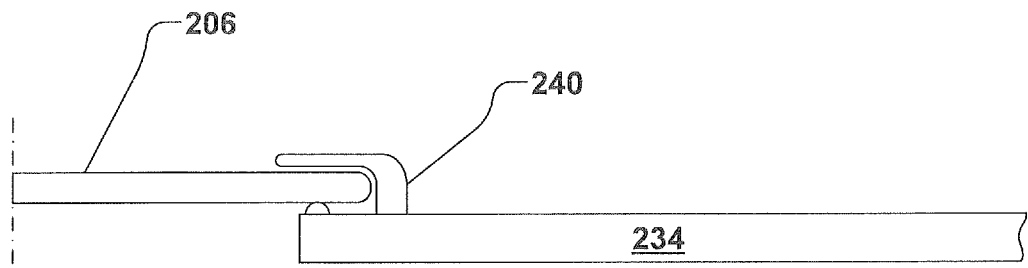
FIG. 8 is a partial cross-sectional view of an exemplary carrier holding a second workpiece.
Figure 9:
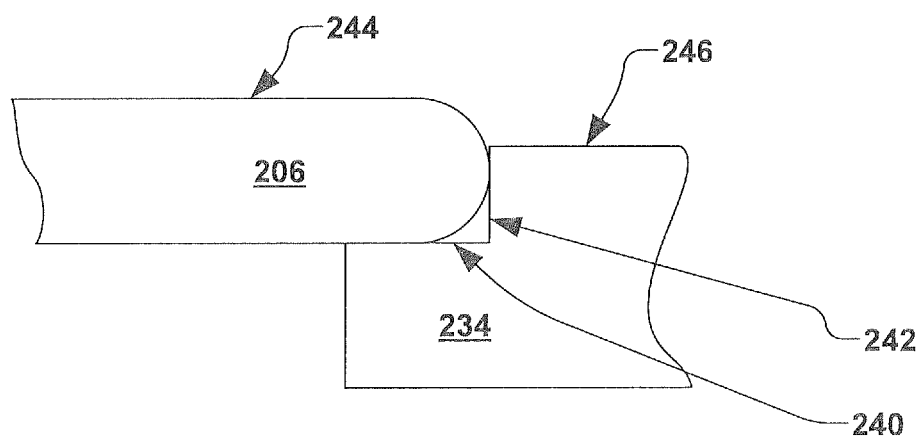
FIG. 9 is a partial cross-sectional view of another exemplary carrier holding a second workpiece.

The clamping device 200 of FIG. 4, in accordance with another exemplary aspect of the disclosure, is further configured to selectively maintain a position of the second workpiece 206 in the second mode, as illustrated in greater detail in FIG. 7. In the second mode of operation, the clamping device 200 is further configured to heat the second workpiece 206 during processing (e.g., ion implantation) via the heater 218 illustrated in FIG. 4. As stated above, the second workpiece 206, for example, is of a second size 208 that is smaller than the first size of the first workpiece 202. As such, a carrier 234 illustrated in FIGS. 7-9 is provided, wherein the carrier is configured to generally support the second workpiece 206. For example, the second workpiece 206 is loaded onto the carrier 234, as illustrated in FIG. 7, wherein the carrier is sized to have the same size (e.g., the first size 204) as the first workpiece 202 of FIG. 3, so that the second workpiece can be handled (e.g., transferred and clamped) in the same manner as the first workpiece is handled. For example, the carrier 234 is of a third size 236 (e.g., a third diameter), wherein the third size of the carrier 300 is approximately the same as the first size 204 of the first workpiece 202 of FIG. 3. The carrier 234 of FIGS. 7-9, for example, is comprised of one or more of aluminum oxide, silicon carbide, silicon dioxide, and any other material with the processing of the second workpiece 206.

Figure 10:
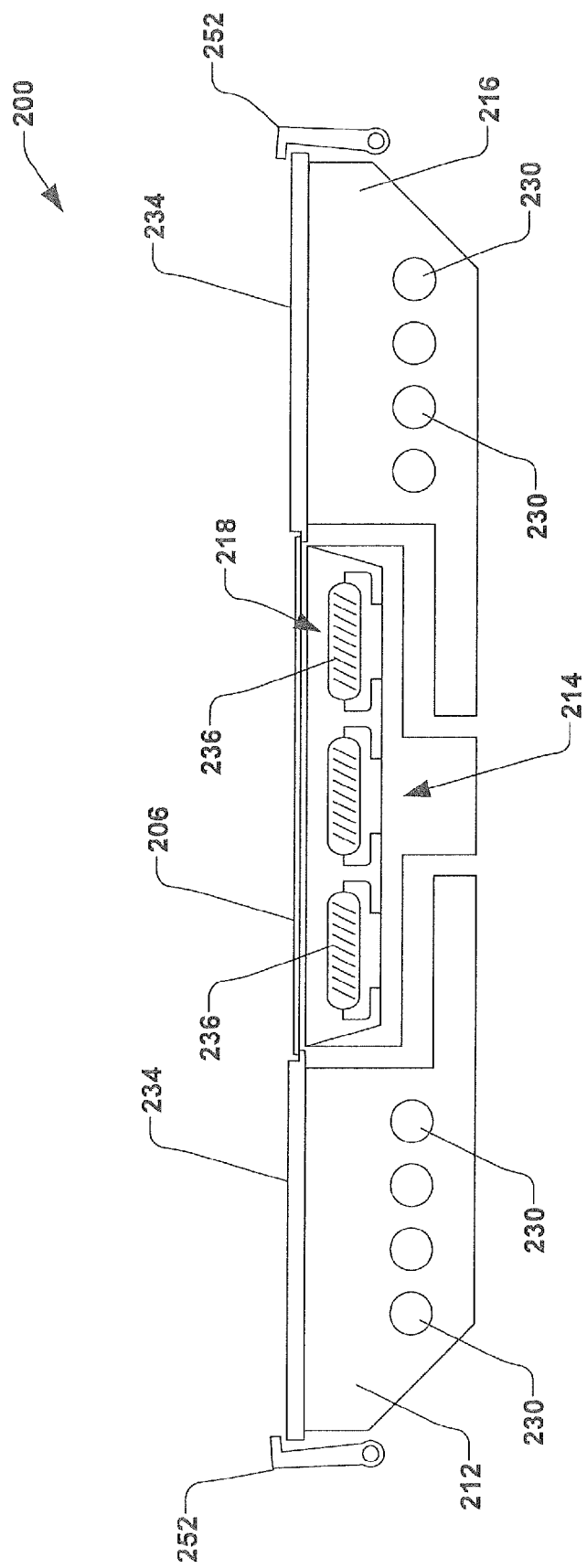
FIG. 10 is a cross-sectional view of an exemplary clamping device having lamp heaters.

Accordingly, the carrier 234 is configured to allow the smaller second workpiece 206 to be placed in general alignment with heater 218 of FIG. 4, so as to be heated prior-to and/or during processing thereof, such as by ion implantation. As illustrated in FIG. 10, the heater 218, in one example, comprises one or more lamp elements 236, wherein the one or more lamp elements are configured to selectively heat the second workpiece 206. Alternatively, the heater 218, as illustrated in another example in FIG. 11, comprises one or more embedded resistive coils 238 embedded therein and configured to selectively heat the second workpiece 206. It should be noted that the heater 218 may alternatively comprise any other heating device (not shown) embedded within the clamping device 200 that is configured to transfer heat to the second workpiece 206, and all such heating devices are contemplated as falling within the scope of the present invention.

Figure 11:
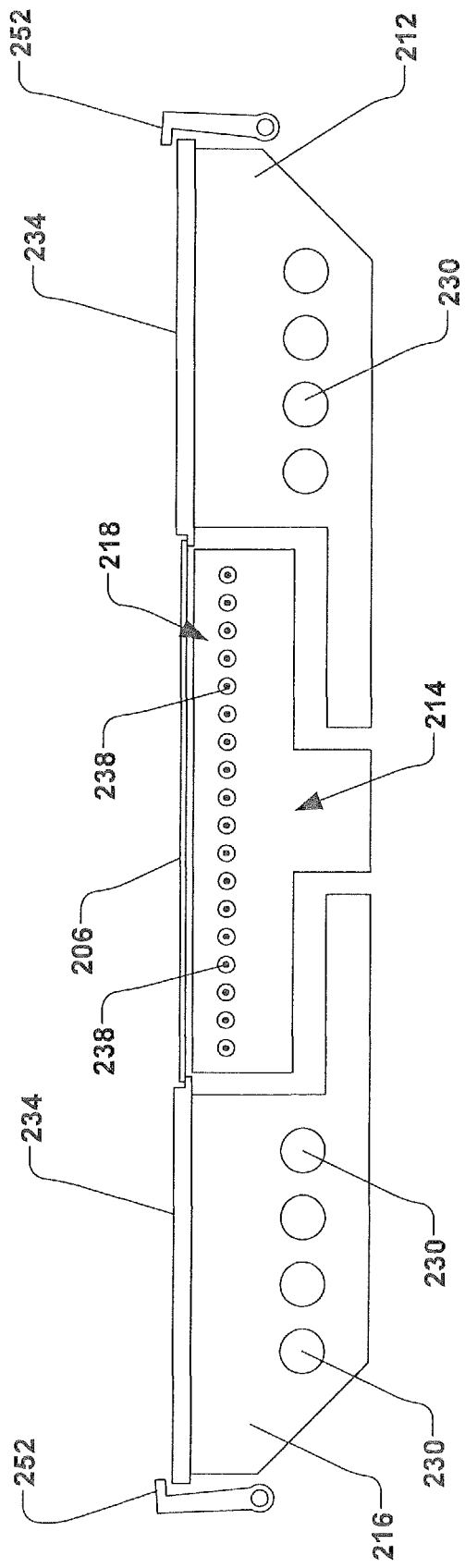
FIG. 11 is a cross-sectional view of another exemplary clamping device having resistive heaters.

In accordance with another example of the present disclosure, the carrier 234 is configured to selectively retain the second workpiece 206 therein, such as by one or more retention devices 240 (e.g., pawls, fingers, pins, or the like), as illustrated in FIGS. 7-8. The one or more retention devices 240, for example, are configured to be stationary or retractable, depending on process requirements. Alternatively, according to another example, a shape of the carrier 234 is configured such that the second workpiece 206 rests on a step 242, as illustrated in FIG. 9, such that second workpiece is nested in the carrier, therein defining the one or more retention devices 240. A surface 244 of the second workpiece 206, for example, can be flush, raised, or depressed from a carrier surface 246 associated with the carrier 300. One or more pins 248, for example, as illustrated in FIG. 7, can be further incorporated into the carrier 234 to align the second workpiece 206 for a flat 250 positioned along the circumference of the second workpiece. Additionally, as illustrated in FIGS. 10 and 11, one or more auxiliary mechanical clamps 252 are provided in another example, wherein the one or more auxiliary mechanical clamps provide further clamping of the first workpiece 202 and/or carrier 234 to the clamping device in addition to, or in replacement of, the electrostatic clamping provided by the annular electrostatic chuck 216. For example, the one or more auxiliary mechanical clamps 252 are implemented for clamping one or more of the first workpiece 202 and/or carrier 234 based on a predetermined temperature of one or more of the first and second workpiece and the annular electrostatic chuck 216.

Accordingly, ion implantations into the first workpiece 202 of the first size 204 (e.g., standard (larger) wafers) can be carried out at lower temperatures and ion implantations into the second workpiece 206 of the second size (e.g., smaller wafers) can be carried out at higher temperatures, utilizing the same above-described clamping device 200.

Figure 12:
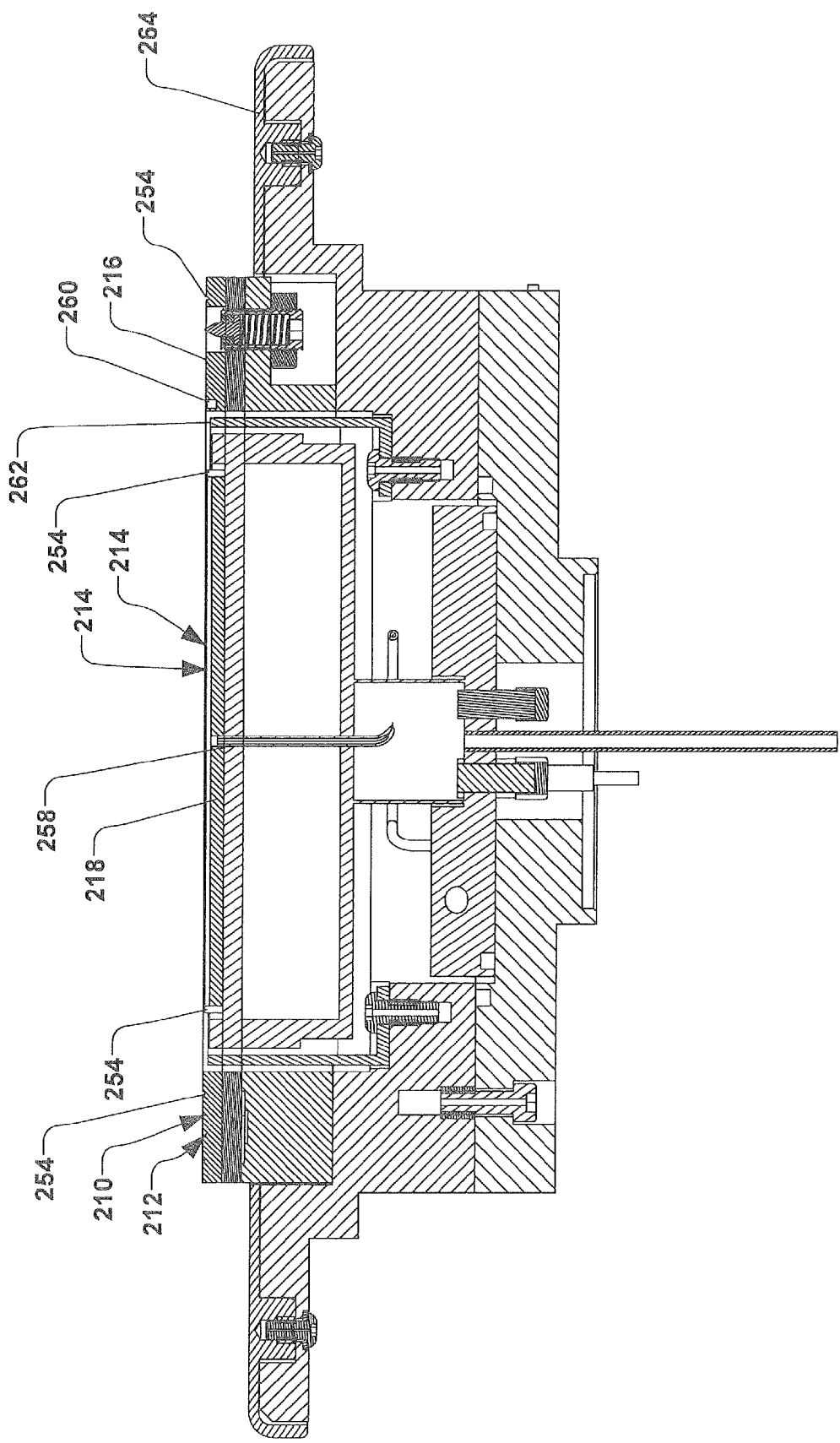
FIG. 12 is a cross-sectional view of an exemplary clamping device showing various aspects of the disclosure.
Figure 13:
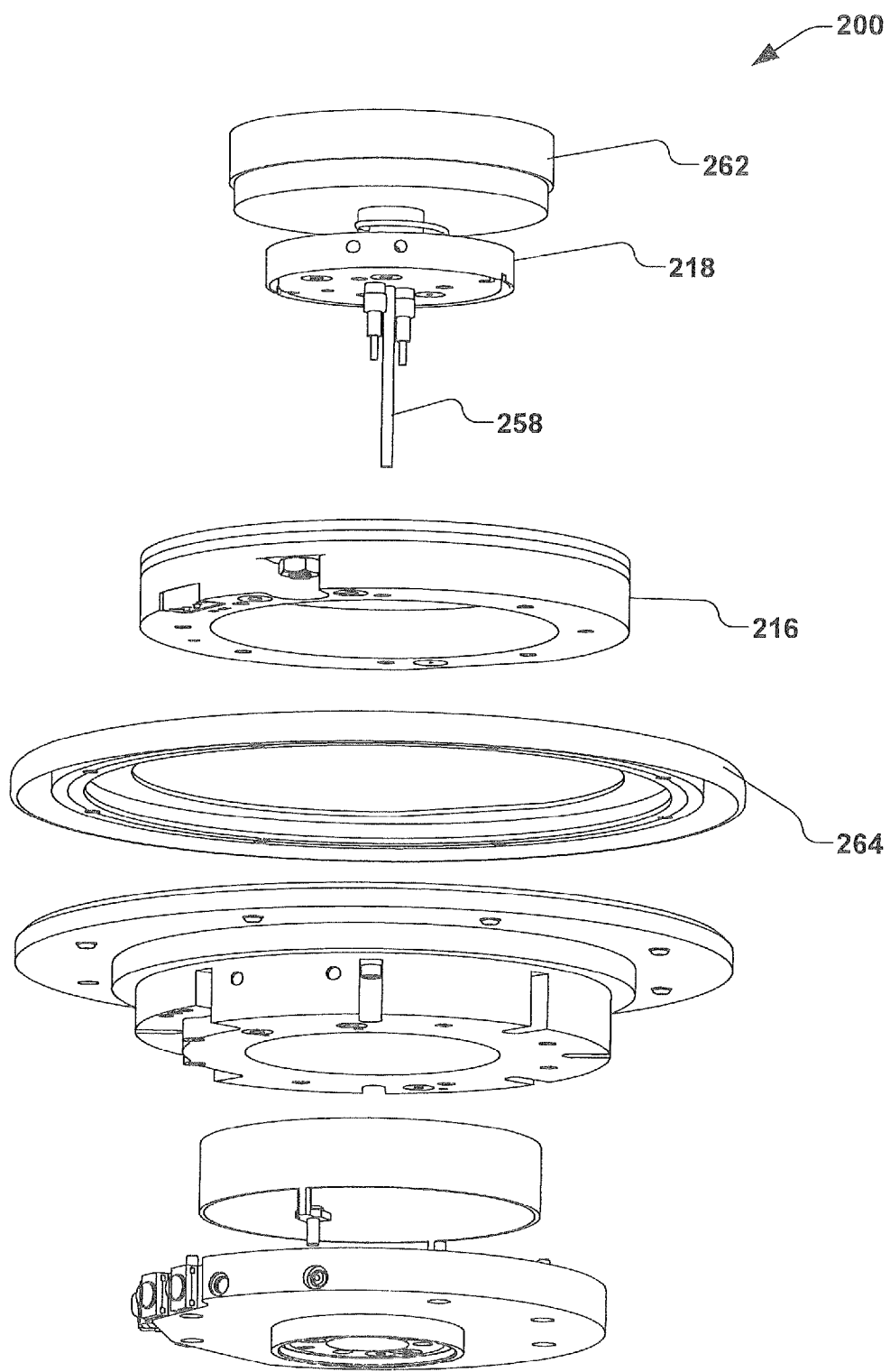
FIG. 13 is a blown-up perspective view of another exemplary clamping device showing other various aspects of the disclosure.

In accordance with another example, one or more lips, steps, or barriers 254 are further provided generally surrounding one or more of the central portion 214 and annulus 212, as illustrated in greater detail in FIGS. 12-13. The one or more lips, steps, and/or barriers 254, for example, generally provide a barrier for a thermally conductive gas, wherein the thermally conductive gas, for example, is pumped into a volume (e.g., illustrated in the present example as volume 256 in the central portion 214) defined by the one or more lips, steps, and/or barriers via a feed tube 258. The feed tube 258, for example, is operable to relay one or more of a gas and electrical signals (e.g., thermocouple, etc.) for purposes of temperature control. The thermally conductive gas provides for greater thermal conduction to the first workpiece 202 or the second workpiece 206 of FIG. 3 through the respective heater 218 and/or the annulus 212, depending on the workpiece (e.g., the first or second workpiece) being processed.

As discussed above, the heater 218 is configured to selectively heat the second workpiece 206 positioned there above. As such, according to another exemplary aspect, the clamping device 200 of FIG. 12 further comprises a temperature monitoring apparatus 260, such as a thermostat, thermocouple, or other temperature monitoring device configured to determine a temperature of one or more of the clamping surface 210 of the clamping device and/or the workpiece (e.g., the first workpiece 202 and/or second workpiece 206 of FIG. 3). Accordingly, the controller 150 of FIG. 1 is further configured to selectively actuate one or more of the heater 218, the annular electrostatic chuck 216, and the cooling via the one or more cooling channels 230, the one or more auxiliary mechanical clamps 252, as well as other aspects and functions of the clamping device 200, based on process requirements and workpiece selection (e.g., first and second workpiece sizes 204 and 208). In addition, according to another exemplary aspect, the clamping device 200 further comprises a heater shield 262 illustrated in FIGS. 12-13, wherein the heater shield generally surrounds the heater 218 and protects the annulus 212 of the clamping device from being exposed to high temperatures generated by the heater. According to another example, a device shield 264 is provided for minimizing damage to the clamping device 200 from the process, such as from ion beam strike, etc.

The present disclosure further provides a method 300 for effectively clamping various sized workpieces to an electrostatic chuck, as illustrated in FIG.

14. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 14:
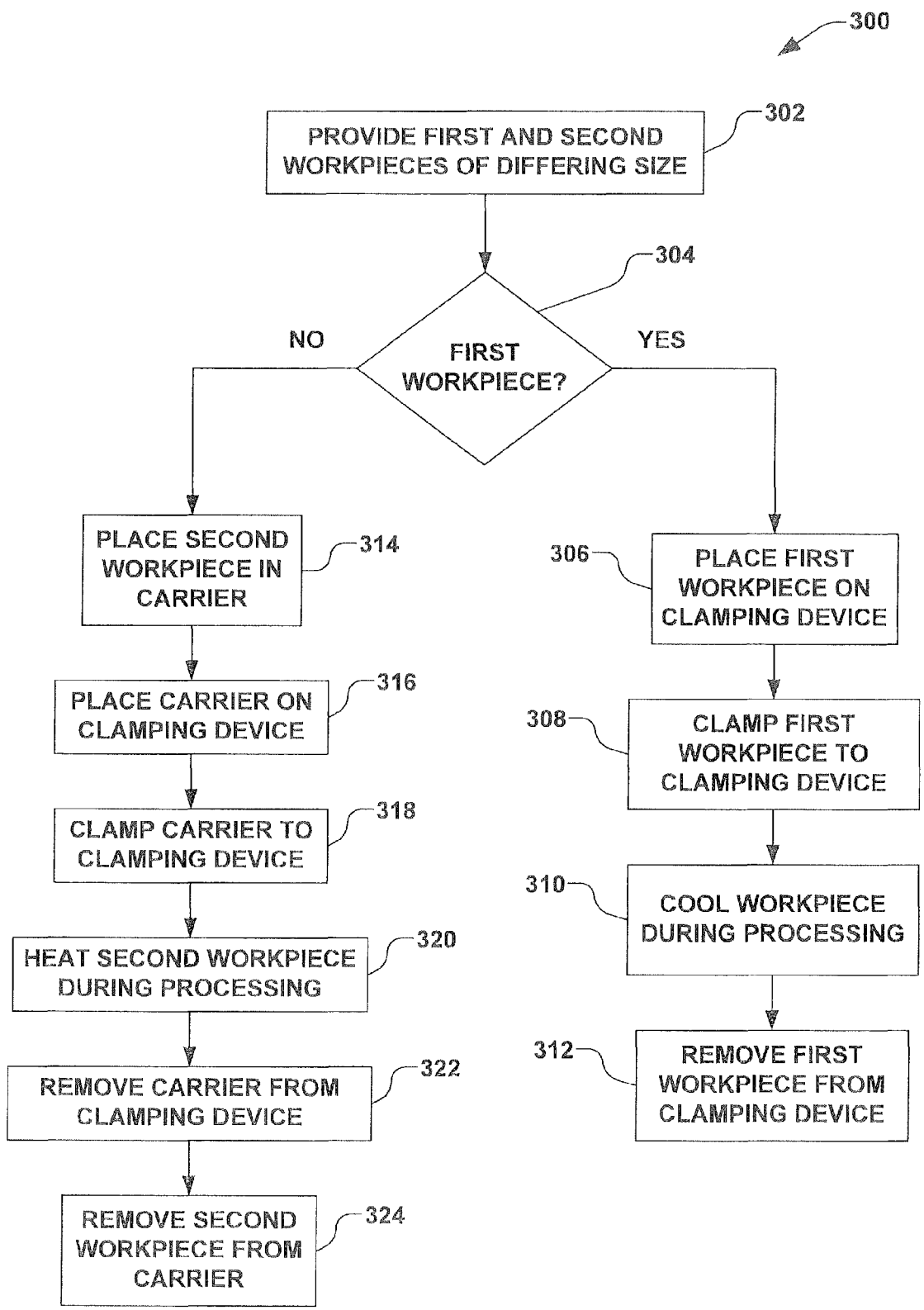
FIG. 14 is an exemplary methodology for clamping workpieces of various sizes according to a further aspect of the disclosure.

According to one example, as illustrated in FIG. 14, the method comprises providing a first workpiece and a second workpiece in act 302, wherein the first and second workpieces differ in size (e.g., the first workpiece has a larger diameter than the second workpiece). A decision is made in act 304 wherein the first workpiece or second workpiece is determined to be processed. If the decision in act 304 is that the first workpiece of the first size is provided, the first workpiece is placed directly on a clamping surface of the clamping device in act 306, and the first workpiece is clamped thereto in act 308. In act 310, the first workpiece is either cooled during processing. In accordance with one example, the annulus is cooled by cooling fluid, and the heater is not energized, therein permitting a general cooling of the first workpiece. The central portion of the clamping device, for example, does not contact the first workpiece. The first workpiece is further removed from the clamping surface of the clamping device in act 312.

If the decision in act 304 is that the second workpiece of the second size is provided, a workpiece carrier is further provided in act 314, wherein the workpiece carrier has a size (e.g., diameter) similar to the size (e.g., diameter) of the first workpiece, and wherein the workpiece carrier is further configured to selectively retain the second workpiece therein, as described above. In one example, the second workpiece is placed in the workpiece carrier in act 314, and the workpiece carrier is placed on the electrostatic clamp in act 316, wherein the second workpiece is positioned above the central portion (e.g., above the heater) of the clamping device. The carrier is then clamped to the clamping device (e.g., electrostatically via the annulus or the auxiliary mechanical clamps described above) in act 318. For example, a clamping voltage is applied to the electrostatic clamp annulus, therein selectively electrostatically clamping the workpiece carrier to the clamping surface. In act 320, the second workpiece is heated, wherein in one example, the second workpiece comprises silicon carbide, wherein high temperature implantation is desired, and wherein the heater is configured to provide substantial heat (e.g., 600-1400C). In act 322, the carrier is removed from the clamping device, and the second workpiece is further removed from the carrier in act 324.

Thus, in accordance with the present invention, a common clamping device is utilized to clamp first and second workpieces having differing diameters thereto, wherein the electrostatic clamp is further configured to thermally heat or cool the respective workpiece, based on desired process conditions and/or requirements. Accordingly, the present invention provides an electrostatic chuck that provides improved clamping capabilities for variously-sized workpieces, and further provides advantageous processing, especially at elevated processing temperatures.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A clamping device for selectively maintaining a position of a first workpiece and a second workpiece, the clamping device comprising:
   an electrostatic clamping plate annulus generally surrounding a central portion, wherein the electrostatic clamping plate annulus comprises a clamping surface and has a diameter associated with a diameter of the first workpiece, wherein the diameter of the first workpiece is larger than a diameter of the second workpiece, and wherein the electrostatic clamping plate annulus is configured to selectively electrostatically clamp a circumferential portion of the first workpiece to the clamping surface thereof;
   a non-electrostatic central portion comprising a heater, wherein the central portion has a diameter associated with the diameter of the second workpiece; and
   a workpiece carrier, wherein the workpiece carrier is configured to substantially hold the second workpiece, and wherein a diameter of the workpiece carrier is associated with the diameter of the electrostatic clamping plate annulus, and wherein the electrostatic clamping plate annulus is further configured to selectively clamp the workpiece carrier to the clamping surface thereof, therein selectively maintaining a position of the second workpiece with respect to the non-electrostatic central portion.

2. The clamping device of claim 1, wherein the electrostatic clamping plate annulus comprises one or more electrodes associated with the circumferential portion of the first workpiece, wherein a voltage applied to the one or more electrodes is operable to selectively electrostatically attract the at least the first workpiece to the clamping surface.

3. The clamping device of claim 2, wherein a voltage applied to the one or more electrodes is operable to selectively electrostatically attract the workpiece carrier to the clamping surface.

4. The clamping device of claim 1, further comprising one or more auxiliary clamping members configured to selectively secure at least a portion of one or more of the first workpiece and the workpiece carrier to the clamping surface.

5. The clamping device of claim 1, wherein one or more of the first workpiece and second workpiece comprises one or more of silicon, silicon carbide, germanium, and gallium arsenide.

6. The clamping device of claim 1, wherein the workpiece carrier comprises one or more of aluminum oxide, silicon carbide, silicon dioxide.

7. The clamping device of claim 1, wherein the heater comprises one or more of heat lamps and resistance heaters associated with the non-electrostatic central portion.

8. The clamping device of claim 1, wherein the heater is positioned below a plane of at least the second workpiece when the second workpiece is held in the workpiece carrier.

9. The clamping device of claim 1, further comprising a shield positioned between the non-electrostatic central portion and the electrostatic clamping plate annulus, wherein the shield generally provides a thermal barrier between the non-electrostatic central portion and the electrostatic clamping plate annulus.

10. The clamping device of claim 1, wherein the workpiece carrier further comprises one or more retention devices configured to selectively restrain the second workpiece therein.

11. The clamping device of claim 1, wherein the workpiece carrier comprises one or more of a flat and a pin configured to selectively retain the second workpiece in a fixed rotational position with respect to the workpiece carrier.

12. The clamping device of claim 1, wherein one or more of the first workpiece and second workpiece comprises one or more of silicon, silicon carbide, germanium, and gallium arsenide.

13. The clamping device of claim 1, wherein the electrostatic clamping plate annulus is further configured to selectively electrostatically clamp the workpiece carrier to the clamping surface thereof, therein selectively maintaining a position of the second workpiece with respect to the non-electrostatic central portion.

14. A method clamping workpieces of varying sizes, the method comprising:
   providing a first workpiece of a first size and a second workpiece of a second size, wherein the first size is greater than the second size;
   providing a workpiece carrier having a third size approximating the first size, and wherein the workpiece carrier is configured to selectively retain the second workpiece therein;
   placing the second workpiece in the workpiece carrier;
   placing one of the first workpiece and workpiece carrier on a clamping surface of a clamping device, the clamping device comprising an electrostatic clamp annulus generally surrounds a non-electrostatic central portion; and
   selectively providing a clamping force to the electrostatic clamp annulus, therein selectively clamping the respective first workpiece and workpiece carrier to the clamping surface.

15. The method of claim 14, further comprising heating the central portion of the clamping device when the workpiece carrier holding the second workpiece is clamped to the clamping surface.

16. The method of claim 15, wherein heating the central portion comprises energizing one or more of a heat lamp assembly and a resistive heater assembly associated with the second workpiece.

17. The method of claim 14, further comprising cooling the electrostatic clamp annulus when the first workpiece is clamped to the clamping surface.

18. The method of claim 14, further comprising selectively applying an auxiliary mechanical clamping force to one or more of the first workpiece, second workpiece, and workpiece carrier, based on one or more predetermined conditions.

19. The method of claim 18, wherein the one or more predetermined conditions comprise a predetermined temperature of one or more of the first and second workpiece and the electrostatic chuck.

20. The method of claim 14, wherein selectively providing a clamping force to the electrostatic clamp comprises selectively providing a clamping voltage to the electrostatic clamp annulus, therein selectively electrostatically clamping the respective first workpiece and workpiece carrier to the clamping surface.

* * * * *